(12) United States Patent
Suzuki

(10) Patent No.: US 7,772,553 B2
(45) Date of Patent: Aug. 10, 2010

(54) SCANNING ELECTRON MICROSCOPE

(75) Inventor: Naomasa Suzuki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 230 days.

(21) Appl. No.: 11/835,697

(22) Filed: Aug. 8, 2007

(65) Prior Publication Data
US 2008/0048117 A1 Feb. 28, 2008

(30) Foreign Application Priority Data
Aug. 22, 2006 (JP) ............................. 2006-225516

(51) Int. Cl.
*H01J 37/26* (2006.01)
(52) U.S. Cl. ...................... 250/310; 250/311; 250/306; 250/307
(58) Field of Classification Search ................. 250/306, 250/307, 310, 311
See application file for complete search history.

(56) References Cited

U.S. PATENT DOCUMENTS

| | | | | |
|---|---|---|---|---|
| 3,833,811 A | * | 9/1974 | Koike et al. ................. | 250/306 |
| 3,852,597 A | * | 12/1974 | Yanaka et al. ............... | 250/311 |
| 3,937,959 A | * | 2/1976 | Namae ........................ | 250/310 |
| 5,731,580 A | * | 3/1998 | Sato et al. .................... | 250/310 |
| 6,025,593 A | * | 2/2000 | Suzuki et al. ................ | 250/310 |
| 6,617,580 B2 | * | 9/2003 | Voelkl ......................... | 250/311 |
| 7,022,983 B2 | * | 4/2006 | Ose et al. .................... | 250/305 |
| 7,235,799 B2 | * | 6/2007 | Nakasuji et al. ........ | 250/492.23 |
| 7,385,197 B2 | * | 6/2008 | Nakasuji et al. ............. | 250/310 |
| 2004/0169141 A1 | * | 9/2004 | Adamec et al. ............. | 250/310 |
| 2005/0051724 A1 | * | 3/2005 | Nakasuji et al. ............. | 250/310 |
| 2006/0054819 A1 | * | 3/2006 | Nakasuji et al. ............. | 250/310 |
| 2006/0102838 A1 | * | 5/2006 | Nakasuji et al. ............. | 250/307 |
| 2006/0202119 A1 | * | 9/2006 | Yamada et al. .............. | 250/310 |
| 2007/0057186 A1 | * | 3/2007 | Nakasuji et al. ............. | 250/310 |
| 2007/0158565 A1 | * | 7/2007 | Nakasuji et al. ............. | 250/310 |
| 2007/0221846 A1 | * | 9/2007 | Todokoro et al. ........... | 250/310 |
| 2008/0315095 A1 | * | 12/2008 | Nakasuji et al. ............. | 250/310 |
| 2009/0039262 A1 | * | 2/2009 | Nakasuji et al. ............. | 250/310 |

FOREIGN PATENT DOCUMENTS

JP 8-241689 A 9/1996
JP 2004-214111 A 7/2004

* cited by examiner

*Primary Examiner*—David A Vanore
*Assistant Examiner*—Michael Maskell
(74) *Attorney, Agent, or Firm*—Crowell & Moring, LLP

(57) ABSTRACT

Disclosed is a scanning electron microscope capable of checking an abrupt change of probe current due to changes in intensities of the respective condenser lenses when the probe current is intended to be changed by changing the intensities of the respective condenser lenses. The scanning electron microscope includes: an electron source for generating a beam of electrons; a first and second condenser lenses each for condensing the beam of electrons; an object lens for narrowly focusing the beam of electrons on a sample; a deflecting system for two-dimensionally scanning over the sample; and a detecting system for detecting secondary electrons generated from the sample due to the irradiation of the beam of electrons on the sample. In the scanning electron microscope, a first and second aperture plates each for blocking parts of the beam of electrons unnecessary for the sample are sequentially arranged between the first and second condenser lenses.

10 Claims, 5 Drawing Sheets

SCANNING ELECTRON MICROSCOPE

CLAIM OF PRIORITY

The present application claims priority from Japanese application JP 2006-225516 filed on Aug. 22, 2006, the content of which is hereby incorporated by reference into this application.

BACKGROUND OF THE INVENTION

1. Field of the Invention

The present invention relates to a scanning electron microscope, and particularly to a scanning electron microscope which controls an electric current of electrons irradiated on a sample.

2. Description of the Prior Art

A scanning electron microscope is an apparatus for forming a scanned image of a sample by: narrowly focusing a beam of electrons generated by an electron source by use of condenser lenses and an object lens; thus irradiating the focused electron beam on the sample while two-dimensionally scanning the focused electron beam over the sample; thereby detecting secondary electrons generated from the sample; and processing a signal resulting from the detection in synchronism with the scanning of the electron beam.

Examples of this type of scanning electron microscope includes a scanning electron microscope which is provided with an aperture for preventing an electron beam from scattering between a first condenser lens and a second condenser lens, and with an object lens aperture at a stage posterior to the second condenser lens, for the purpose of controlling an amount of the electron beam (see Japanese Patent Application Laid-open Publication No. Hei. 8-241689 (FIG. 6)).

SUMMARY OF THE INVENTION

In the case of scanning electron microscopes, an increasing importance has been recently placed on a probe current to be irradiated on a sample in addition to conditions for a magnifying power, an accelerating voltage and the like from a viewpoint of acquiring a sample image.

Because of increasingly miniaturized patterns of semiconductor devices, scanning electron microscopes have been more often used for inspecting the semiconductor devices. Inspection of semiconductor devices places an importance on throughput. It is natural that a time needed for taking an image of a sample should be shortened. Nevertheless, an image used for inspection is required to have a somewhat higher S/N (signal-to-noise) ratio. With this taken into consideration, it is necessary that the S/N ratio should be kept while a time needed for taking an image is shortened. For this reason, a scheme has been conceived for increasing electrons generated from a sample by increasing an amount of probe current.

If, however, an amount of probe current is simply increased in this manner, the electron beam becomes large, and a resolution of the sample image accordingly decreases. To avoid this, it is necessary that an amount of probe current should be increased in a case where a priority is given to throughput. Otherwise, it is necessary that a switch should be controlled to decrease an amount of probe current in a case where a priority is given to a resolution.

An example of a scheme for switching an amount of probe current is a method of changing an extracting voltage in an electron source. In a case of a Schottky emission electron source and the like, a method of changing a filament current and a method of changing a suppressor voltage can be used as well. Nevertheless, as long as these schemes are used, it is impossible to change an amount of probe current to a large extent because the extent to which the probe current can be changed is approximately twice to five times as large.

Against this background, an example of a scheme of changing an amount of probe current to a large extent is a method of changing an amount of electrons traveling through aperture plates by changing the intensities respectively of the condenser lenses. Use of this method makes it possible to change an amount of probe current to an extent that the amount of probe current is in the order of hundreds to thousands times as large.

However, this scheme has a problem that the intensity of condenser lenses has to be controlled accurately. That is because the crossover point (the focal point) of the condenser lenses comes closer to an aperture of the aperture plate for the purpose of acquiring a larger amount of probe current so that the amount of probe current varies rapidly.

An object of the present invention is to provide a scanning electron microscope capable of preventing an amount of probe current from changing rapidly due to changes in the intensities respectively of the condenser lenses while the amount of probe current is in the middle of being changed by changing the intensities respectively of the condenser lenses.

For the purpose of achieving the foregoing object, a first aspect of the present invention is a scanning electron microscope including: an electron source for generating a beam of electrons; a first and second condenser lenses each for condensing the beam of electrons; an object lens for narrowly focusing the beam of electrons on a sample; a deflecting system for two-dimensionally scanning over the sample; and a detecting system for detecting secondary electrons which are generated from the sample due to the irradiation of the beam of electrons on the sample, the scanning electron microscope in which a first and second aperture plates each for blocking parts of the beam of electrons unnecessary for the sample are sequentially arranged between the first and second condenser lenses.

In addition, a second aspect of the present invention is the scanning electron microscope as recited in the first aspect of the present invention, in which the diameter of an aperture of the second aperture plate arranged closer to the sample is set larger than that of an aperture of the first aperture plate arranged closer to the electron source.

Moreover, a third aspect of the present invention is the scanning electron microscope as recited in the first aspect of the present invention, in which the diameter of the aperture of the second aperture plate arranged closer to the sample is set equal to that of the aperture of the first aperture plate arranged closer to the electron source.

Additionally, a fourth aspect of the present invention is the scanning electron microscope as recited in any one of the first to third aspects of the present invention, in which each of the aperture plates includes a mechanism of enabling the aperture plate to two-dimensionally move in a plane perpendicular to an optical axis along which the beam of electrons travels.

Furthermore, a fifth aspect of the present invention is the scanning electron microscope as recited in any one of the first to fourth aspect of the present invention, characterized by including a controlling means for controlling the intensities respectively of the condenser lenses in order to change the amount of electrons traveling through the respective aperture plates.

The present invention makes it possible to check an abrupt change of probe current even if a crossover point changes in the vicinity of each of the aperture plates, in a case where the intensities respectively of the condenser lenses are changed for the purpose of changing the probe current. This makes it possible to use the probe current by switching an amount of the probe current, and to accordingly enhance the flexible use of the scanning electron microscope.

DESCRIPTION OF THE PREFERRED EMBODIMENT

Descriptions will be provided hereinafter for an embodiment of a scanning electron microscope according to the present invention by use of the drawings.

Figure 1:
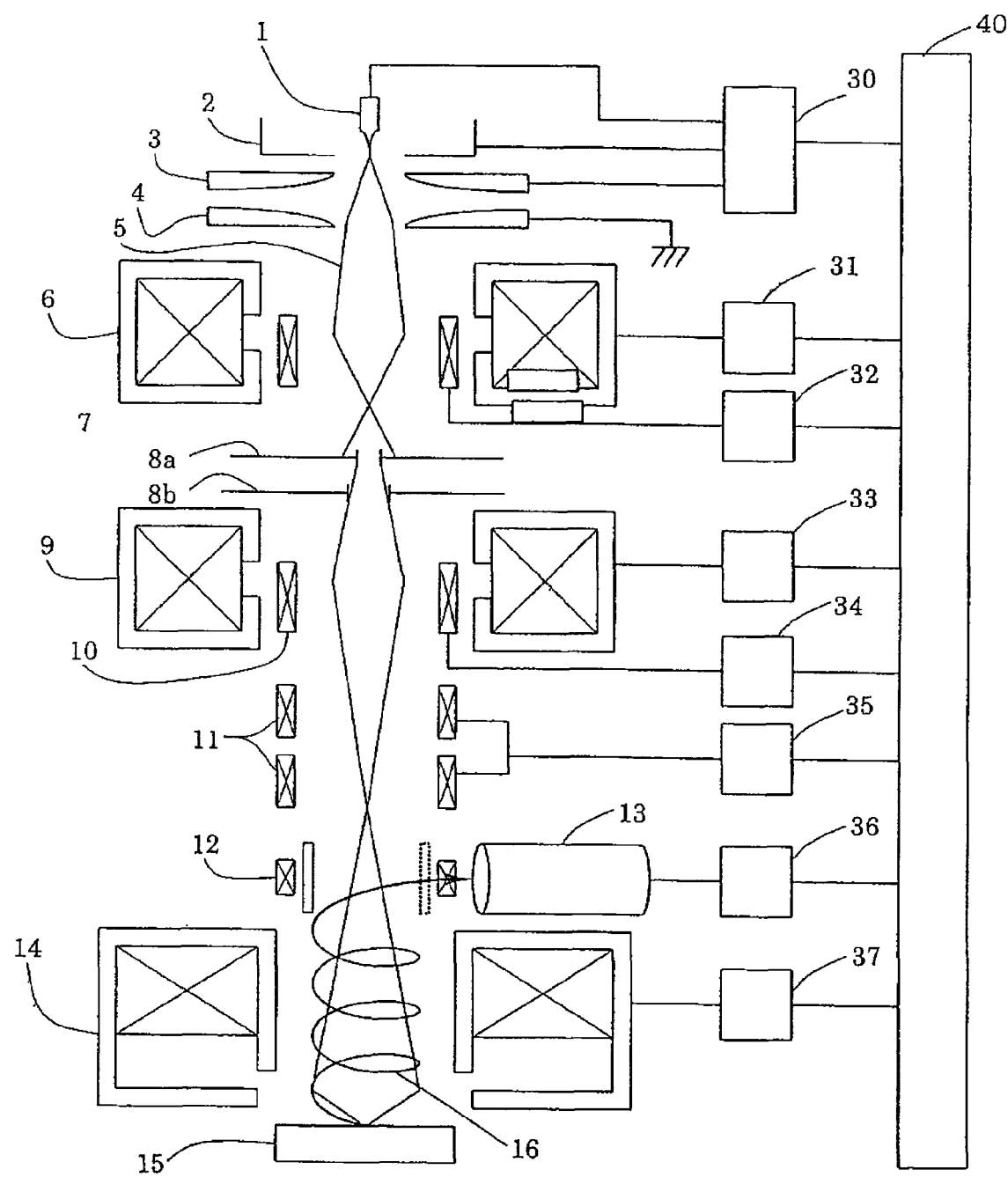
FIG. 1 is a diagram illustrating a basic configuration showing an embodiment of a scanning electron microscope according to the present invention.

FIG. 1 is a diagram illustrating a basic configuration showing the embodiment of the scanning electron microscope according to the present invention. As shown in FIG. 1, a high voltage controlling power supply 30 controlled by a microprocessor (CPU) 40 is connected to a cathode 1 serving as an electron source and a first anode 3. A suppressor electrode 2 is arranged between the cathode 1 and the first anode 3.

A second anode 4 is arranged in a stage posterior to the first anode 3. The high voltage controlling power supply 30 controlled by the microprocessor 40 is connected to the cathode 1 and the second anode 4. A first condenser lens 6 is arranged in a stage posterior to the second anode 4. This condenser lens 6 is controlled by a lens controlling power supply 31. An alignment coil 7 is arranged inside the first condenser lens 6. This alignment coil 7 is controlled by an alignment coil current controlling power supply 32.

A first aperture plate 8a and a second aperture plate 8b each for preventing scattered electrons from entering toward the sample are sequentially arranged in a stage posterior to the first condenser lens 6 in the direction toward a sample 15 (in a downward direction in FIG. 1). The diameter of an aperture of this second aperture plate 8b is set larger than that of an aperture of the first aperture plate 8a.

A second condenser lens 9 is arranged in a stage posterior to the second aperture plate 8b. This second condenser lens 9 is controlled by a lens controlling power supply 33. An astigmatism corrector 10 is arranged in a vicinity of this second condenser lens 9. This astigmatism corrector 10 is controlled by an astigmatism corrector controlling power supply 34.

A scanning deflector 11 is arranged in a stage posterior to the second condenser lens 9. This scanning deflector 11 is controlled by a scanning deflector controlling power supply 35. A field generator 12 (an E×B detector) is arranged in a stage posterior to the scanning deflector 11. A secondary electron detector 13 is arranged at a side of this field generator 12. A detection signal from this secondary electron detector 13 is processed by the microprocessor 40 in synchronism with the scanning of a beam of electrons 5, and a resultant detection signal is displayed as a sample image on an image display 36.

An object lens 14 is arranged in a stage posterior to the field generator 12. This object lens 14 is controlled by an object lens controlling power supply 37. The sample 15 is arranged under this object lens 14.

Descriptions will be provided next for an operation of the embodiment of the scanning electron microscope according to the present invention. When an extracting current is applied between the cathode 1 serving as the electron source and the first anode 3 by the high voltage controlling power supply 30 controlled by the microprocessor (CPU) 40, the beam of electrons 5 with a predetermined emission current is extracted from the cathode 1.

Subsequently, when an accelerating voltage is applied between the cathode 1 and the second anode 4 by the high voltage controlling power supply 30 controlled by the microprocessor 40, the beam of electrons 5 emitted from the cathode 1 is accelerated, and thus travels to the lens system in the posterior stage.

The beam of electrons 5 is condensed by the first condenser lens 6 controlled by the lens controlling power supply 31, and an unnecessary area of the beam of electrons 5 is restricted by the aperture plate 8a. Thereafter, the beam of electrons 5 is narrowly focused on the sample 15 by the second condenser lens 9 controlled by the lens controlling power supply 33 and by the object lens 14 controlled by the object lens controlling power supply 37.

Subsequently, a scan signal depending on a magnification for the observation is controlled by the scanning deflector controlling power supply 35, and is thus given to the scanning deflector 11. Thereby, the beam of electrons 5 is two-dimensionally scanned over the sample 5, and concurrently an astigmatism of the beam of electrons 5 is corrected by the astigmatism corrector 10 controlled by the astigmatism corrector controlling power supply 34.

Secondary electrons 16 which are generated from the sample 15 due to the irradiation of the beam of electrons 5 on the sample 5 travel through the object lens 14, and are thus guided to the field generator 12 (the E×B detector). The field generator 12 deflects the secondary electrons 16 to the direction of the secondary electron detector 13 while not deflecting the beam of electrons 5. Thus, the secondary electrons 16 are detected by the secondary electron detector 13. A signal resulting from the detection is processed by the microprocessor 40 in synchronism with the scanning of the beam of electrons 5, and the resultant detection signal is displayed as the sample image on the image display 36.

Figure 2:
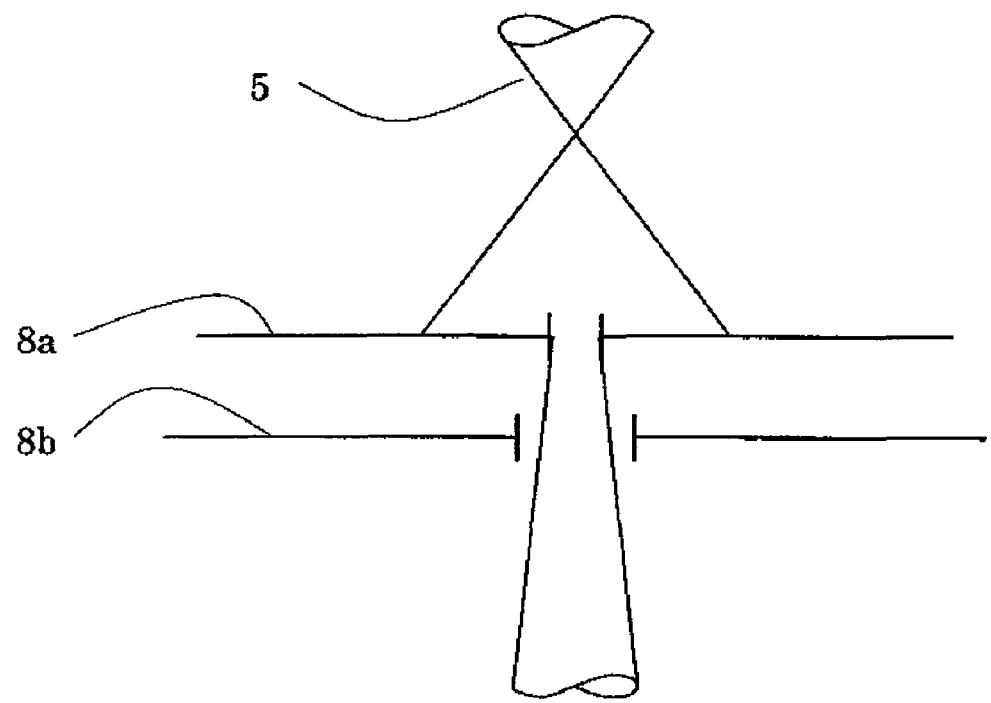
FIG. 2 is a magnified view for explaining an operation of an aperture plate constituting the embodiment of the scanning electron microscope according to the present invention.

In a case where the crossover point of the first condenser lens is set closer to the electrons than the first aperture plate 8a in the process of irradiation the beam of electrons, most of the beam of electrons 5 is restricted by the first aperture plate 8a, and the beam of electrons 5 traveling through the first aperture plate 8a and the second aperture plate 8b are accordingly smaller in amount. That is because the diameter of the aperture of the first aperture plate 8a is set smaller than that of the aperture of the second aperture plate 8b as shown in FIG. 2. Thereby, an amount of probe current irradiated on the sample 15 is capable of being decreased.

Figure 3:
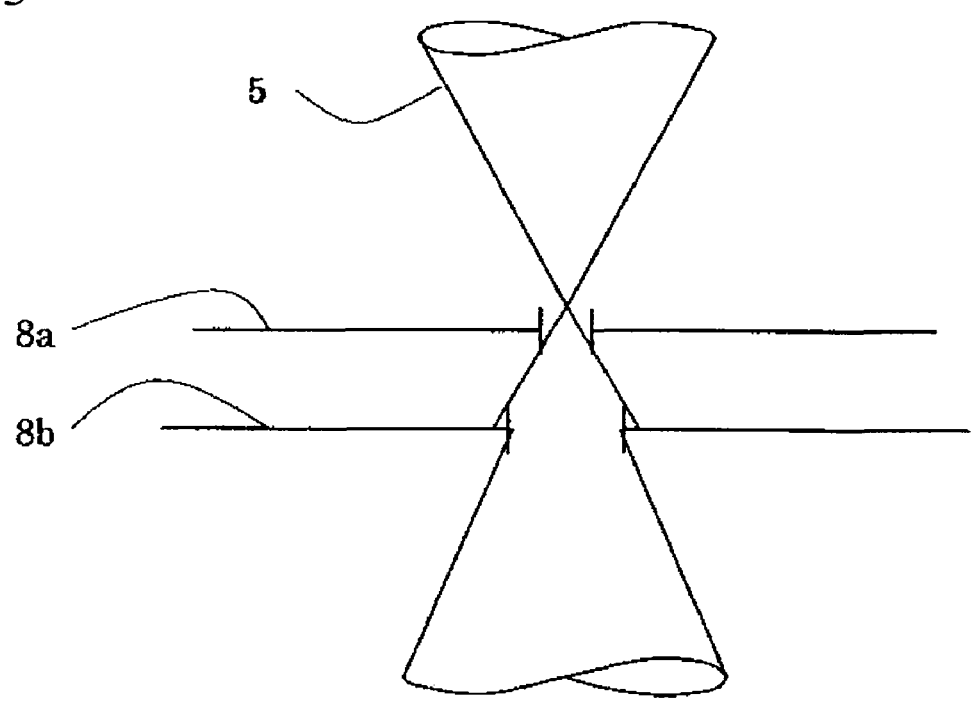
FIG. 3 is a magnified view for explaining another operation of the aperture plate constituting the embodiment of the scanning electron microscope according to the present invention.

Furthermore, in a case where the crossover point is set closer to a vicinity of the second aperture plate 8b through the control carried out by the first condenser lens 6, the beam of electrons 5 travels to the side of the sample 15 via the aperture of the first aperture plate 8a while not restricted by the first aperture plate 8a as shown in FIG. 3, on a basis of the relationship between the diameters of the respective apertures.

For this reason, the amount of probe current irradiated on the sample 15 becomes larger. Because, however, the beam of electrons 5 is restricted by the second aperture plate 8b, this restriction makes it possible to check the amount of probe current from increasing extremely.

Figure 4:
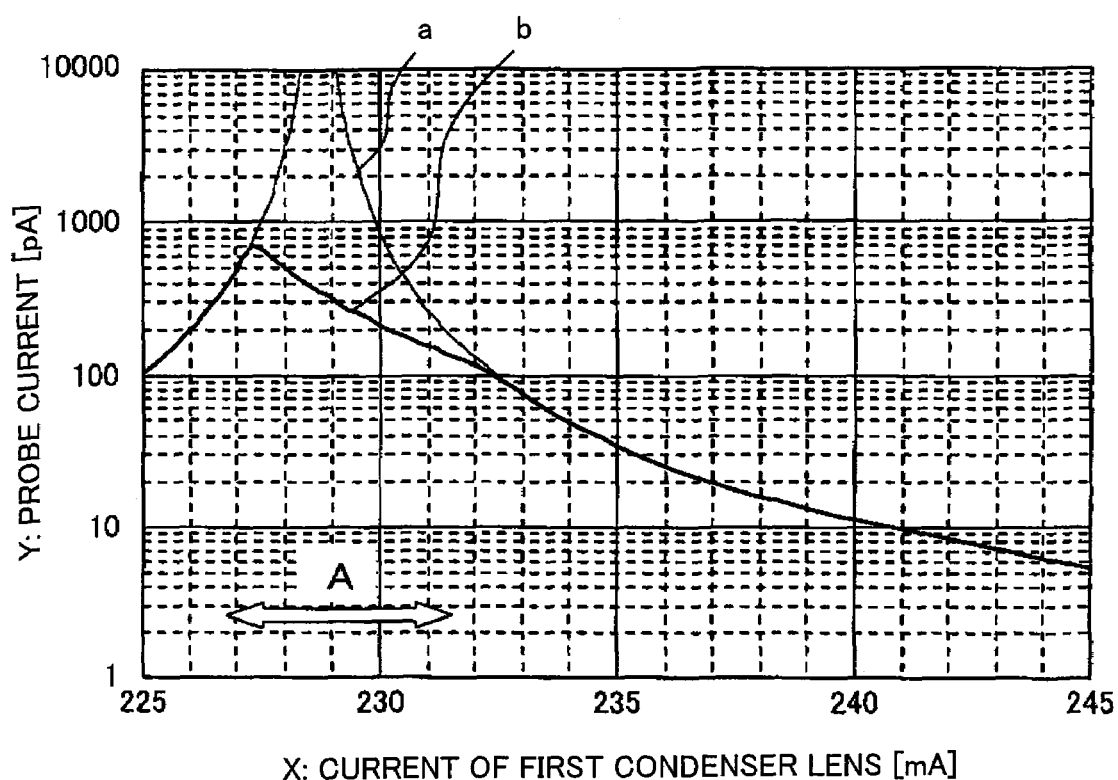
FIG. 4 is a characteristic diagram showing a relationship between a coil current X of a first condenser lens and a probe current Y irradiated on a sample in the embodiment of the scanning electron microscope according to the present invention.

FIG. 4 is a characteristic diagram showing a relationship between a coil current X of the first condenser lens 6 configured of an electromagnetic coil and an electric current Y irradiated on the sample 15. In FIG. 4, a narrow line a is a characteristic curve showing a characteristic which is exhibited in a case where no second aperture plate 8b is included in the scanning electron microscope (in a case of one aperture), and a bold line b is a characteristic curve showing a characteristic which is exhibited in a case where the first aperture plate 8a and the second aperture plate 8b are included in the scanning electron microscope (in a case of two apertures). In this case, calculations are made with an assumption that the diameter of the aperture of the second aperture plate 8b is 2.5 times as large as that of the aperture of the first aperture plate 8a while the distance between the first aperture plate 8a and the second aperture plate 8b is 20 mm.

As shown in FIG. 4, the crossover point goes closer to the first aperture plate 8a as the coil current X of the first condenser lens 6 is decreased. It is learned from this relationship that the amount of probe current increases. In a case where the coil current X of the first condenser lens 6 is larger than any value in a range A in FIG. 4, the change in the probe current Y is not larger than the change in the coil current X of the first condenser lens 6. When the coil current X falls within the range A, however, the change in the probe current Y becomes larger in the case of the one aperture.

Specifically, if the coil current X of the first condenser lens 6 is not set accurately, it is likely that the probe current Y may deviate largely from a set value. The two-aperture configuration obtained by arranging the second aperture plate 8b at the side of the first aperture plate 8a which is closer to the sample makes it possible to restrict the beam of electrons 5 by use of the second aperture plate 8b even within the range A where the change in the probe current Y is larger than the change in the coil current X of the first condenser lens 6. This checks the change in the probe current Y from being larger than the change in the coil current X of the first condenser lens 6.

As described above, the two-aperture configuration obtained by arranging the two aperture plates in the stage posterior to the first condenser lens 6 makes it unnecessary to set the intensity of the first condenser lens 6 with high accuracy in a case where the probe current Y is changed to a large extent. The probe current Y is capable of being set minutely by controlling the extracting current applied to the first anode 3 shown in FIG. 1 and a suppressor voltage applied to the suppressor electrode 2 shown in FIG. 2 by use of the high voltage controlling power supply 30.

The embodiment of the present invention makes it possible to check an abrupt change of the probe current even if the crossover point changes in the vicinity of the aperture plate in the case where the intensities respectively of the condenser lens are changed for the purpose of changing the amount of probe current. This makes it possible to use the probe current by switching the amount of probe current, and to accordingly enhance the flexible use of the scanning electron microscope.

Figure 5:
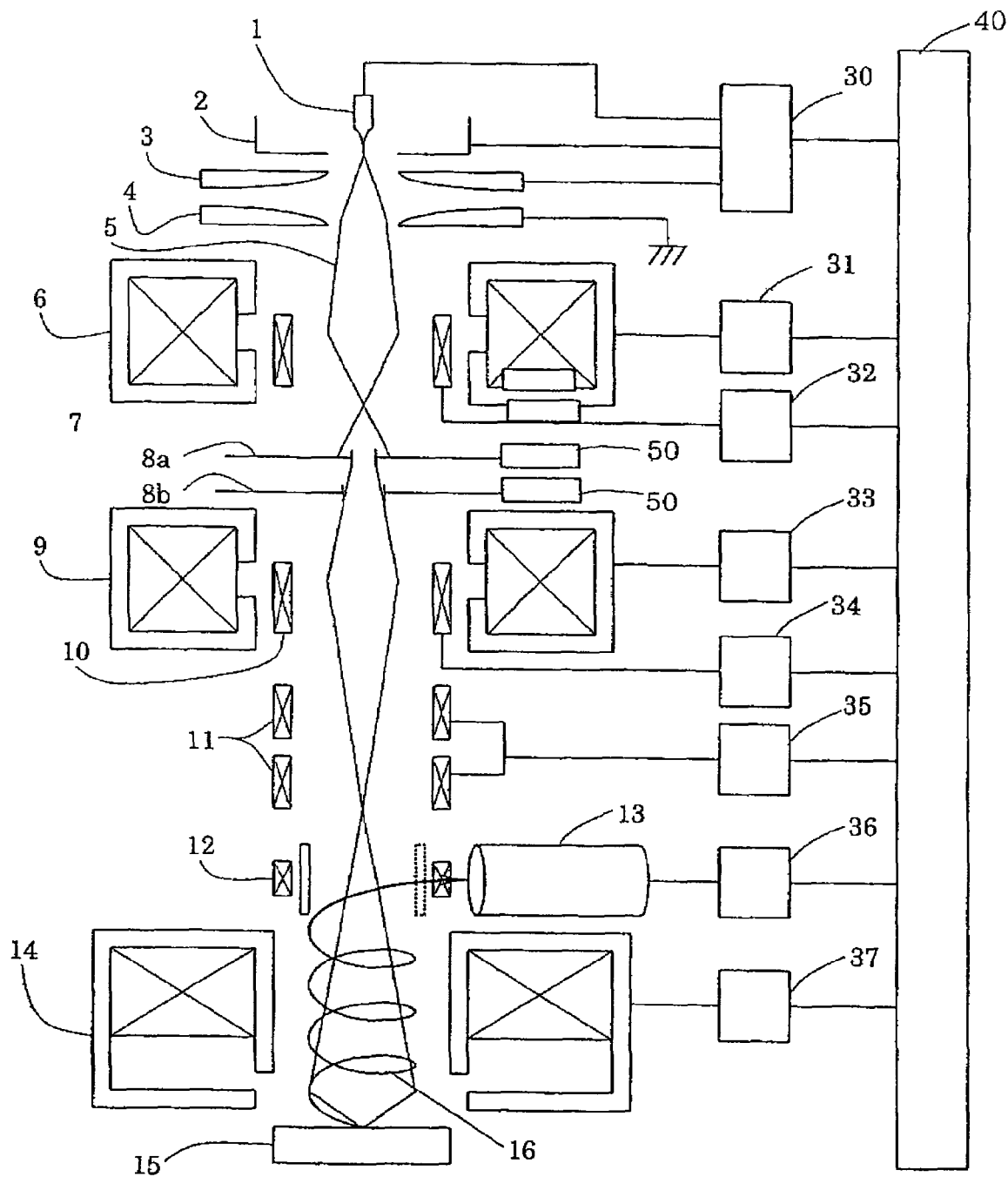
FIG. 5 is a diagram showing a basic configuration of another embodiment of the scanning electron microscope according to the present invention.

FIG. 5 is a diagram showing a basic configuration of another embodiment of the scanning electron microscope according to the present invention. As long as components in FIG. 5 are the same as those in FIG. 1, the components in FIG. 5 are denoted by the same reference numerals as those in FIG. 1 are. For this reason, detailed descriptions will be omitted for those components.

This embodiment is a scanning electron microscope in which the first aperture plate 8a and the second aperture plate 8b are provided with movement aligners 50 for respectively aligning the first aperture plate 8a and the second aperture plate 8b to the optical axis along which the beam of electrons 5 travels. These movement aligners 50 are those enabling the first aperture plate 8a and the second aperture plate 8b to move two-dimensionally in their planes perpendicular to the optical axis.

Figure 6:
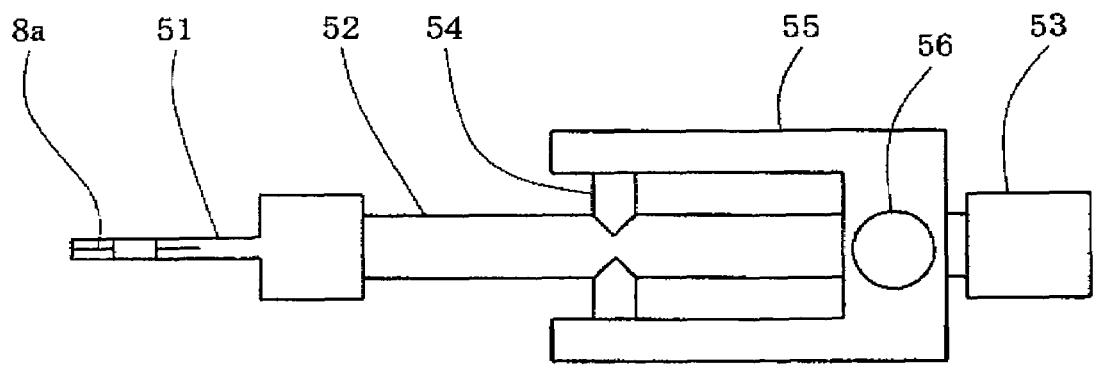
FIG. 6 is a schematic diagram of an aperture plate movement adjusting apparatus used in the embodiment of the scanning electron microscope according to the present invention which is shown in FIG. 5.

Detailed configurations respectively of the movement aligners 50 will be described by use of FIG. 6. For convenience of explanation, descriptions will be provided only for the movement aligner 50 in the fist aperture plate 8a. The first aperture plate 8a is fixed to an aperture plate receiving part 51. The first aperture plate receiving part 51 is fixed to an extremity of a shaft (not illustrated) in an aperture plate supporting part 52. The other extremity of the aperture plate supporting part 52 is provided with a control 53 linked to the extremity of the shaft (not illustrated) in the aperture plate supporting part 52. By rotating this control 53, the first aperture plate 8a is capable of being moved in a backward-forward direction (in a rightward-leftward direction in FIG. 5).

The middle portion of the aperture plate supporting part 52 is swingably supported by a housing 55 with a vertical axle 54 interposed in between. The housing 55 is provided with a control 56 whose extremity abuts on the aperture plate supporting part 52. A portion opposite to the control 56 between the aperture plate supporting part 52 and the housing 55 is provided with a return spring (not illustrated). By rotating the control 56, the first aperture plate 8a is capable of being swung about the vertical axle 54.

The first aperture plate 8a and the second aperture plate 8b which are arranged as the two stages are aligned to the optical axis as follows. First of all, the first aperture plate 8a is made away from the optical axis by the movement aligner 50. The second aperture plate 8b whose aperture is larger in diameter is aligned to the optical axis. Subsequently, the first aperture plate 8a is inserted, and is thus aligned to the optical axis.

The first aperture plate 8a and the second aperture plate 8b are capable of being aligned to the optical axis as follows. First of all, a scan signal controlled by the alignment coil current controlling power supply 32 is given to the alignment coil 7 arranged in the vicinity of the first condenser lens 6. Thereby, the first aperture plate 8a and the second aperture plate 8b are aligned to the optical axis by the movement aligner 50 in order that a location which causes the beam of electrons to travel through the apertures of the respective aperture plate 8a and 8b can be a center. Fine alignment is capable of being carried out by flowing the coil current to the alignment coil 7 through control by the alignment coil current controlling power supply 32 in order that the alignment coil 7 can generate a magnetic field for the deflection.

Figure 7:
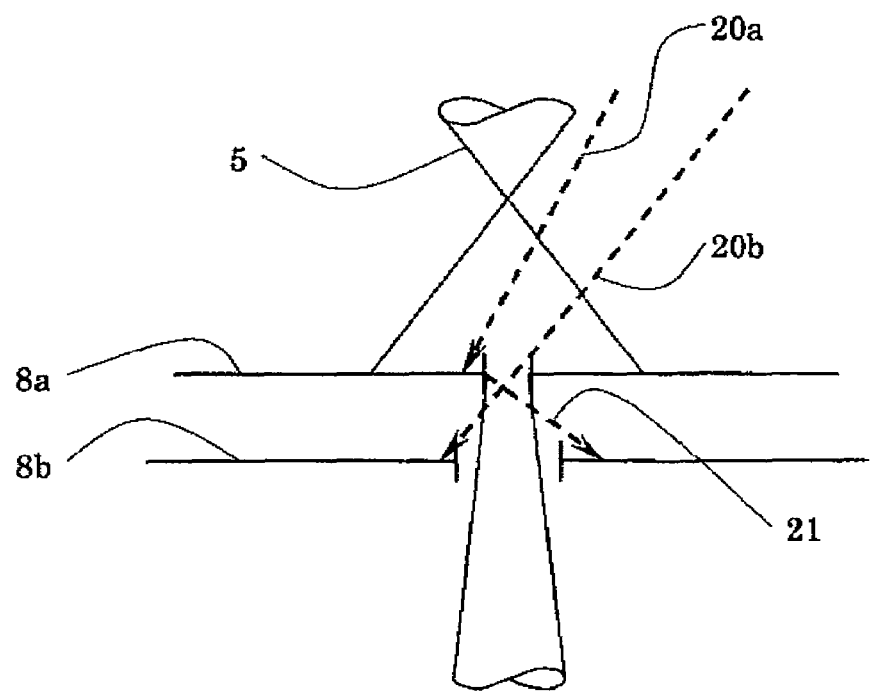
FIG. 7 is a magnified view for explaining yet another operation of the aperture plate constituting the embodiment of the scanning electron microscope according to the present invention.

The foregoing embodiment of the present invention brings about another effect that the two-stage configuration of the aperture plates decreases an amount of scattered electrons irradiated on the sample 15. This point will be described by use of FIG. 7. Components in FIG. 7 which are denoted by the same reference numerals as those in FIG. 2 are the same as those in FIG. 2.

Besides the beam of electrons 5 as the main beam, scattered electrons 20a and 20b generated from the electron source and the like are irradiated on the first aperture plate 8a arranged closer to the electron source. The scattered electrons 20a are capable of being restricted by the first aperture plate 8a. Nevertheless, the scattered electrons 20b travel through the aperture of the first aperture plate 8a, and may be accordingly incapable of being restricted by the first aperture plate 8a in some cases.

However, the arrangement of the second aperture plate 8a at the side of the first aperture plate 8a which is closer to the sample 15 enables the second aperture plate 8b to restrict the scattered electrons 20b which have traveled through the aperture of the first aperture plate 8a. This makes it possible to prevent the scattered electrons 20a and 20b from being irradiated on the sample 15.

Moreover, the irradiation of the beam of electrons 5 on the first aperture plate 8a enables scattered electrons 21 generated from a side surface of the aperture of the first aperture plate 8a to be restricted by the second aperture plate 8b arranged at the side of the first aperture plate 8a which is closer to the sample 15 as well. This makes it possible to prevent the scattered electrons 21 from being irradiated on the sample 15.

It should be noted that the diameter of the aperture of the second aperture plate 8b may be set equal to that of the aperture of the first aperture plate 8a although the diameter of the aperture of the first aperture plate 8a is set smaller than that of the aperture of the second aperture plate 8b in the foregoing embodiments. This case is also capable of bringing about the same effect as the foregoing embodiments do.

What is claimed is:

1. A scanning electron microscope including:
   an electron source for generating an electron beam;
   a first and second condenser lenses each for condensing the electron beam;
   an object lens for narrowly focusing the electron beam on a sample;
   a deflecting system for two-dimensionally scanning over the sample;
   a detecting system for detecting secondary electrons which are generated from the sample due to the irradiation of the electron beam on the sample; and
   a first aperture plate having a first aperture and a second aperture plate having a second aperture that are sequentially arranged between the first and second condenser lenses,
   wherein the electron beam that passes the second aperture consists of the electron beam whose axis is parallel to a central axis of the first aperture.

2. The scanning electron microscope as recited in claim 1, wherein the diameter of an aperture of the second aperture plate arranged closer to the sample is set larger than that of an aperture of the first aperture plate arranged closer to the electron source.

3. The scanning electron microscope as recited in claim 1, wherein the diameter of the aperture of the second aperture plate arranged closer to the sample is set equal to that of the aperture of the first aperture plate arranged closer to the electron source.

4. The scanning electron microscope as recited in claim 1, wherein each of the aperture plates includes a mechanism of enabling the aperture plate to two-dimensionally move in a plane perpendicular to an optical axis along which the electron beam travels.

5. The scanning electron microscope as recited in claim 2, wherein each of the aperture plates includes a mechanism of enabling the aperture plate to two-dimensionally move in a plane perpendicular to an optical axis along which the electron beam travels.

6. The scanning electron microscope as recited in claim 3, wherein each of the aperture plates includes a mechanism of enabling the aperture plate to move two-dimensionally in a plane perpendicular to an optical axis along which the electron beam travels.

7. The scanning electron microscope as recited in claim 1, comprising a controlling means for controlling the intensities respectively of the condenser lenses in order to change an amount of electrons traveling through the respective aperture plates.

8. The scanning electron microscope as recited in claim 2, comprising a controlling means for controlling the intensities respectively of the condenser lenses in order to change an amount of electrons traveling through the respective aperture plates.

9. The scanning electron microscope as recited in claim 3, comprising a controlling means for controlling the intensities respectively of the condenser lenses in order to change an amount of electrons traveling through the respective aperture plates.

10. The scanning electron microscope as recited in claim 4, comprising a controlling means for controlling the intensities respectively of the condenser lenses in order to change an amount of electrons traveling through the respective aperture plates.

* * * * *